US007932019B2

(12) United States Patent
Yoon et al.

(10) Patent No.: US 7,932,019 B2
(45) Date of Patent: Apr. 26, 2011

(54) GETTERING MEMBERS, METHODS OF FORMING THE SAME, AND METHODS OF PERFORMING IMMERSION LITHOGRAPHY USING THE SAME

(75) Inventors: Jin-Young Yoon, Seoul (KR); Hyun-Woo Kim, Gyeonggi-do (KR); Chan Hwang, Seoul (KR); Yun-Kyeong Jang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 774 days.

(21) Appl. No.: 11/983,993

(22) Filed: Nov. 13, 2007

(65) Prior Publication Data

US 2008/0131817 A1 Jun. 5, 2008

(30) Foreign Application Priority Data

Nov. 13, 2006 (KR) .................. 10-2006-0111620
Jun. 14, 2007 (KR) .................. 10-2007-0058563

(51) Int. Cl.
*G03F 7/26* (2006.01)
(52) U.S. Cl. ....................... 430/327; 430/313
(58) Field of Classification Search ............... 430/327, 430/313, 323; 134/1
See application file for complete search history.

(56) References Cited

U.S. PATENT DOCUMENTS

| 7,595,142 B2 * | 9/2009 | Endo et al. | 430/311 |
| 7,776,506 B2 * | 8/2010 | Wang et al. | 430/270.1 |
| 2006/0033898 A1 | 2/2006 | Cadee et al. | 355/53 |
| 2006/0275706 A1 * | 12/2006 | Corliss et al. | 430/311 |
| 2006/0275709 A1 | 12/2006 | Van Buel | 430/311 |
| 2008/0129970 A1 * | 6/2008 | Furukawa et al. | 355/30 |

FOREIGN PATENT DOCUMENTS

| JP | 2005252247 | 9/2005 |
| KR | 1020050120412 | 12/2005 |
| KR | 10-2007-0109005 A | 11/2007 |
| WO | WO 2006/080250 A1 | 8/2006 |
| WO | WO 2006/115268 A1 | 11/2006 |

OTHER PUBLICATIONS

Korean Intellectual Property Office, Notice of Decision to Grant Patent, KR 10-2007-0058563, issued Nov. 14, 2008.

* cited by examiner

*Primary Examiner* — Kathleen Duda
*Assistant Examiner* — Caleen O Sullivan
(74) *Attorney, Agent, or Firm* — Myers Bigel & Sibley Sajovec, PA

(57) ABSTRACT

Provided herein are gettering members that include a monitor substrate and a conditioning layer thereon. Also provided herein are methods of forming gettering layers and methods of performing immersion lithography processes using the same.

16 Claims, 13 Drawing Sheets

US 7,932,019 B2

GETTERING MEMBERS, METHODS OF FORMING THE SAME, AND METHODS OF PERFORMING IMMERSION LITHOGRAPHY USING THE SAME

CROSS-REFERENCE TO RELATED APPLICATION

This application claims the benefit of Korean Patent Application Nos. 2006-0111620, filed Nov. 13, 2006, and 2007-0058563, filled Jun. 14, 2007, the disclosure of each of which is hereby incorporated herein by reference in its entirety.

FIELD OF THE INVENTION

The present invention relates semiconductor apparatuses and processes. More particularly, the present invention relates apparatuses and processes for immersion lithography.

BACKGROUND OF THE INVENTION

Apparatuses for immersion lithography typically include a substrate chuck, a reservoir for an immersion liquid and a pattern-transferring system. The pattern-transferring system typically includes a photomask and optical lenses above and beneath the photomask. During an exposure process in immersion lithography, radiation may pass through the pattern-transferring system and the immersion liquid to the photoresist layer on a substrate provided on the substrate chuck. During this exposure step of the immersion lithography process, the passing of the radiation through the immersion liquid may increase the depth-of-focus relative to photolithography performed in air, which may allow for a more effective transfer of the photomask's pattern to the photoresist layer.

However, other challenges may result in immersion lithography. For example, residues from the photoresist layer may leach into the immersion liquid. Such photoresist residues present in the immersion liquid may diffuse-reflect the exposing radiation and may subsequently become deposited on the substrate chuck and its peripheral elements.

A "dummy" layer may be used to prevent or decrease the deposition of photoresist residues on immersion lithography apparatuses. For example, before the exposure step in an immersion lithography process, a dummy layer may be deposited on the substrate chuck, and then a pre-immersion lithography process may be performed thereon while the dummy layer is in contact with the immersion liquid.

Typically, the dummy layer includes a dummy substrate, which is generally formed of single-crystalline silicon that may a native oxide layer formed thereon, often irregularly, due to the environment of semiconductor manufacturing lines. The immersion liquid may be water. In such cases, the native oxide layer may be relatively hydrophilic, while the single-crystalline silicon of the dummy substrate may be relatively hydrophobic. Thus, water droplets may irregularly form on the dummy layer during and/or after the pre-immersion lithography process. Since water droplets remaining on the dummy layer may have a greater affinity for the native oxide layer relative to the dummy layer, evaporation from the dummy layer per unit time may not be uniform across the surface, and thus the surface temperature of the substrate chuck covered by the dummy layer may not be uniform.

Additionally, water droplets may form on the immersion lithography apparatus during the pre-immersion lithography process, and then photoresist residues in the water droplet may adhere to the substrate chuck and its peripheral elements. The water droplets and the photoresist residues therein remaining on the substrate chuck and its peripheral elements may also reduce the reliability of the immersion lithography apparatus.

An immersion lithography apparatus is described in U.S. Patent Publication No. 2006/0033898 A1 to Cadee et al. According thereto, the apparatus limits the immersion liquid to a predetermined region of the substrate using a water supply system, barrier layer and an element. However, such an apparatus does not allow for the removal of photoresist residues before or after an immersion lithography process, nor does it describe a method of maintaining constant surface temperature across the substrate chuck.

SUMMARY OF THE INVENTION

Provided herein according to some embodiments of the invention are gettering members that include a monitor substrate and a conditioning layer including an organic compound on the monitor substrate.

In some embodiments of the invention, the conditioning layer may include hexamethyldisilazane (HMDS). In some embodiments, the conditioning layer may include at least one of perfluoroacetate, hexafluoroalcohol and polytetrafluoroethylene. In some embodiments, the conditioning layer may include at least one of an acrylate, meta-acrylate, polynorbornene, polystyrene, polyethylene, polycycloolefin, polycycloolefin-co-maleic anhydride, polymethyl methacrylate and polyvinyl ether-co-maleic anhydride.

In some embodiments of the invention, the monitor substrate includes single-crystalline silicon, poly-crystalline silicon, amorphous silicon, silicon oxide or any combination thereof.

Also provided according to embodiments of the invention are methods of forming gettering members. Such methods include forming a conditioning layer including an organic compound on a monitor substrate. When HMDS is included in the conditioning layer, methods of forming the conditioning layer may include facing the monitor substrate toward a liquid including HMDS; and evaporating the HMDS such that the HMDS is deposited on the monitor substrate to form the conditioning layer. Other methods of forming gettering members include melting or dissolving a solid hydrophobic material; applying the melted or dissolved hydrophobic material to the monitor substrate; and optionally applying heat to the monitor substrate to form a film of the hydrophobic material.

Additionally, provided herein are methods of performing immersion lithography processes that include (a) providing a gettering layer that includes a monitor substrate and a conditioning layer thereon, between a substrate chuck and an immersion liquid reservior of an immersion lithography apparatus;

(b) filling the immersion liquid reservoir with an immersion liquid, thereby contacting the immersion liquid with a surface of the gettering layer;

(c) removing the gettering layer from the substrate chuck;

(d) providing a process substrate having a photoresist thereon to the substrate chuck; and (e) exposing the photoresist to radiation through a pattern transferring system.

In particular embodiments, filling the reservoir with the immersion liquid includes providing a substantially constant flow of immersion liquid into the reservoir through one portion of the reservoir and out of the reservoir through another portion of the reservoir.

In addition, in particular embodiments, exposing the photoresist layer includes:

(a) providing a process substrate having a photoresist layer thereon between the substrate chuck and the reservoir, such that the photoresist layer faces the reservoir;

(b) filling the reservoir with the immersion liquid such that a surface of the photoresist layer contacts the immersion liquid;

(c) sequentially passing exposing radiation through the pattern-transferring system and the immersion liquid to selected portions of the photoresist layer;

(d) detaching the process substrate from the substrate chuck; and optionally (e) repeating steps (a) through (d) with at least one other process substrate.

Step (d) of these methods may further include providing a gettering layer, including a monitor substrate and a conditioning layer thereon, between a substrate chuck and an immersion liquid reservoir of an immersion lithography apparatus; filling the immersion liquid reservoir with an immersion liquid, thereby contacting the immersion liquid with the gettering layer; passing radiation through a pattern transferring system to the gettering layer; and detaching the gettering layer from the substrate chuck.

BRIEF DESCRIPTION OF THE DRAWINGS

The foregoing and other objects, features and advantages of the invention will become more apparent from the following more particular description of exemplary embodiments of the invention and the accompanying drawings. The drawings are not necessarily to scale, emphasis instead being placed upon illustrating the principles of the invention.

DETAILED DESCRIPTION OF THE INVENTION

Figure 1:
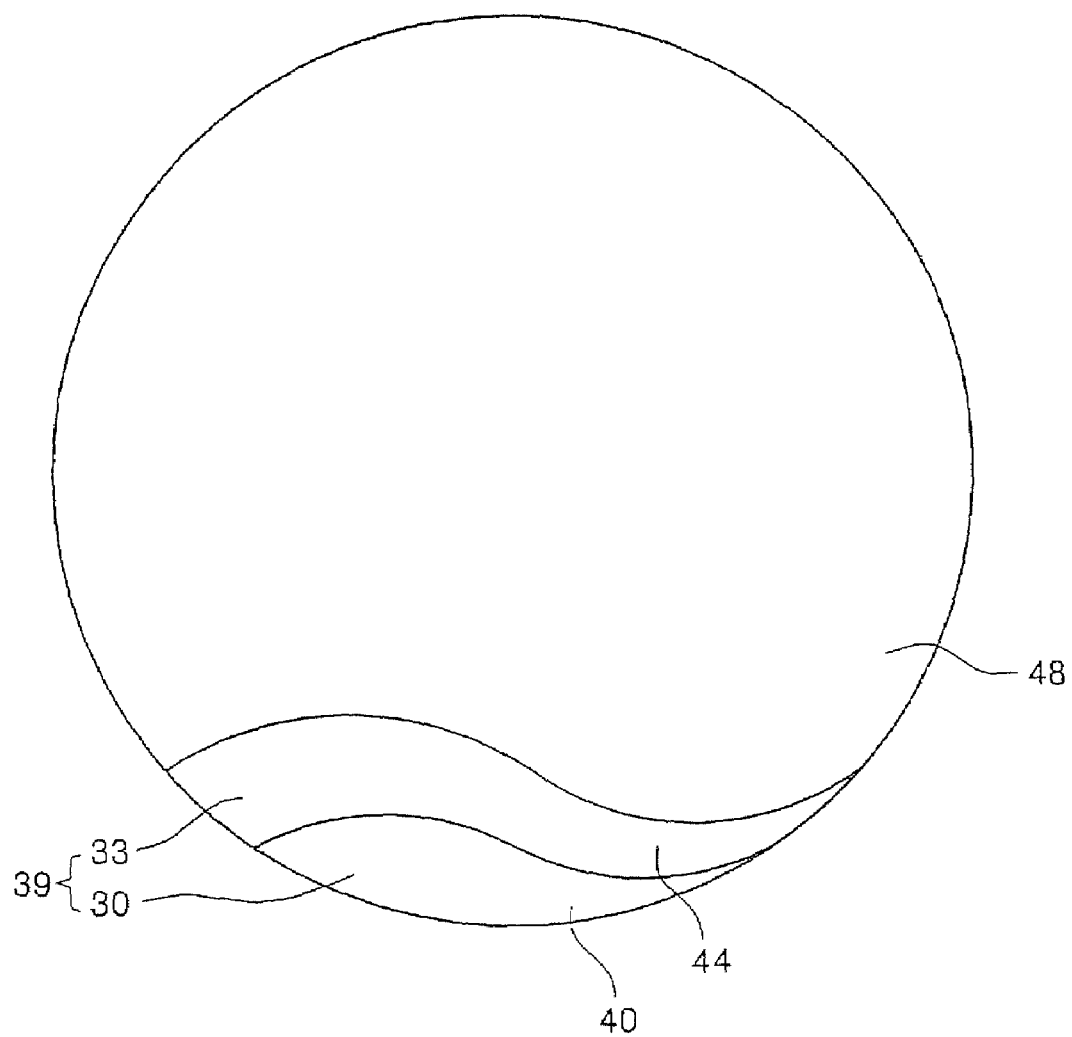
FIG. 1 is a cross-sectional view of a monitor or process substrate according to some embodiments of the present invention.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Though the terms "selected", "other", "one side", "the other side" and "the others" may be used herein to describe several elements, it should be understood that the terms used herein are for the purpose of describing particular embodiments only and are not intended to be limiting. For example, a first element may be named as a second element, or a second element may be named as a first element without departing from the scope of the present invention. Herein, the term "and/or" includes every combination which can be inferred from items listed with at least one relation. The terms "lower, upper, over and under," which are particularly relative, may be used herein for the purpose of simply describing the selected element, a relative relationship between another element and a certain configuration, or the configuration illustrated in the drawings. It is also to be understood that the terminology used herein is for the purpose of describing particular embodiments only and is not intended to be limiting.

Gettering members according to some embodiments of the present invention and methods of forming the same will now be described in detail with reference to the accompanying drawings.

FIG. 1 is a cross-sectional view of a monitor or process substrate according to some embodiments of the present invention.

Referring to FIG. 1, a gettering member 39 according to an embodiment of the present invention may include a monitor substrate 30. In particular embodiments, the monitor substrate 30 may be silicon-based and may be formed of single-crystalline silicon, poly-crystalline silicon, amorphous silicon, silicon oxide or any combination thereof. Additionally, in particular embodiments, the monitor substrate 30 may be formed by chemical vapor deposition (CVD), physical vapor deposition (PVD), atomic layer deposition (ALD) or any combination thereof. Furthermore, the monitor substrate 30 may or may not be conductive, and in some embodiments, the monitor substrate 30 may be partially conductive.

According to some embodiments of the present invention, a conditioning layer 33 may be on the monitor substrate 30. In particular embodiments, the conditioning layer 33 may include an organic compound. Furthermore, in particular embodiments of the present invention, the conditioning layer 33 may include hexamethyldisilazane (HMDS, $[(CH_3)_3Si]_2NH$). In some embodiments wherein the conditioning layer 33 includes HMDS, the conditioning layer 33 may be formed by preparing a HMDS solution, facing a portion of the monitor substrate 30 toward the HMDS solution, and evaporating the HMDS solution such that HMDS is deposited on the monitor substrate 30. In some embodiments, the HMDS may be evaporated by boiling the HMDS solution for a predetermined time at a temperature in a range of about 100° C. to about 200° C.

According to some embodiments of the present invention, the conditioning layer 33 may include a fluorinated compound, including a fluorinated polymer (e.g., $C_WH_xF_yO_Z$). Any suitable fluorinated compound may be used, but in some embodiments, the fluorinated compound may include at least one of the compounds selected from the group consisting of perfluoroacetate (PFA), hexafluoroalcohol (HFA) and polytetrafluoroethylene (PTFE). In some embodiments, the conditioning layer 33 may include a non-fluorinated compound (e.g., $C_xH_yO_z$). In some embodiments, the non-fluorinated compound is a polymer, and in some embodiments, the non-fluorinated compound may include at least one of the polymers selected from the group consisting of an acrylate, a metal-acrylate, polynorbornene, polystyrene, polyethylene, a polycycloolefin, a polycycloolefin-co-maleic anhydride (COMA), polymethyl methacrylate (PMMA) and polyvinyl ether-co-maleic anhydride (VEMA).

According to some embodiments of the present invention, the fluorinated or non-fluorinated conditioning layer 33 may be formed by melting or dissolving in a solvent a fluorinated or non-fluorinated compound, applying the fluorinated or non-fluorinated compound to the monitor substrate 30, and forming the fluorinated or non-fluorinated conditioning layer, e.g., by heating the monitoring substrate. In particular embodiments, the fluorinated or non-fluorinated compound may be dissolved in at least one of the solvents selected from the group consisting of propylene glycol monomethyl ether acetate (PGMEA), propylene glycol monomethyl ether (PGME), ethyl lactate (EL), 2-heptanone, gamma butyrolactone (GBL), tetrahydrofuran (THF), chloroform, methylene chloride, cyclohexane and acetonitrile. The fluorinated or non-fluorinated film may be formed by heating the monitoring substrate 30 for a predetermined time at a temperature in a range of about 50° C. to about 400° C.

Methods of performing immersion lithography processes using a gettering member according to an embodiment of the present invention will now be described with reference to other accompanying drawings.

Figure 2:
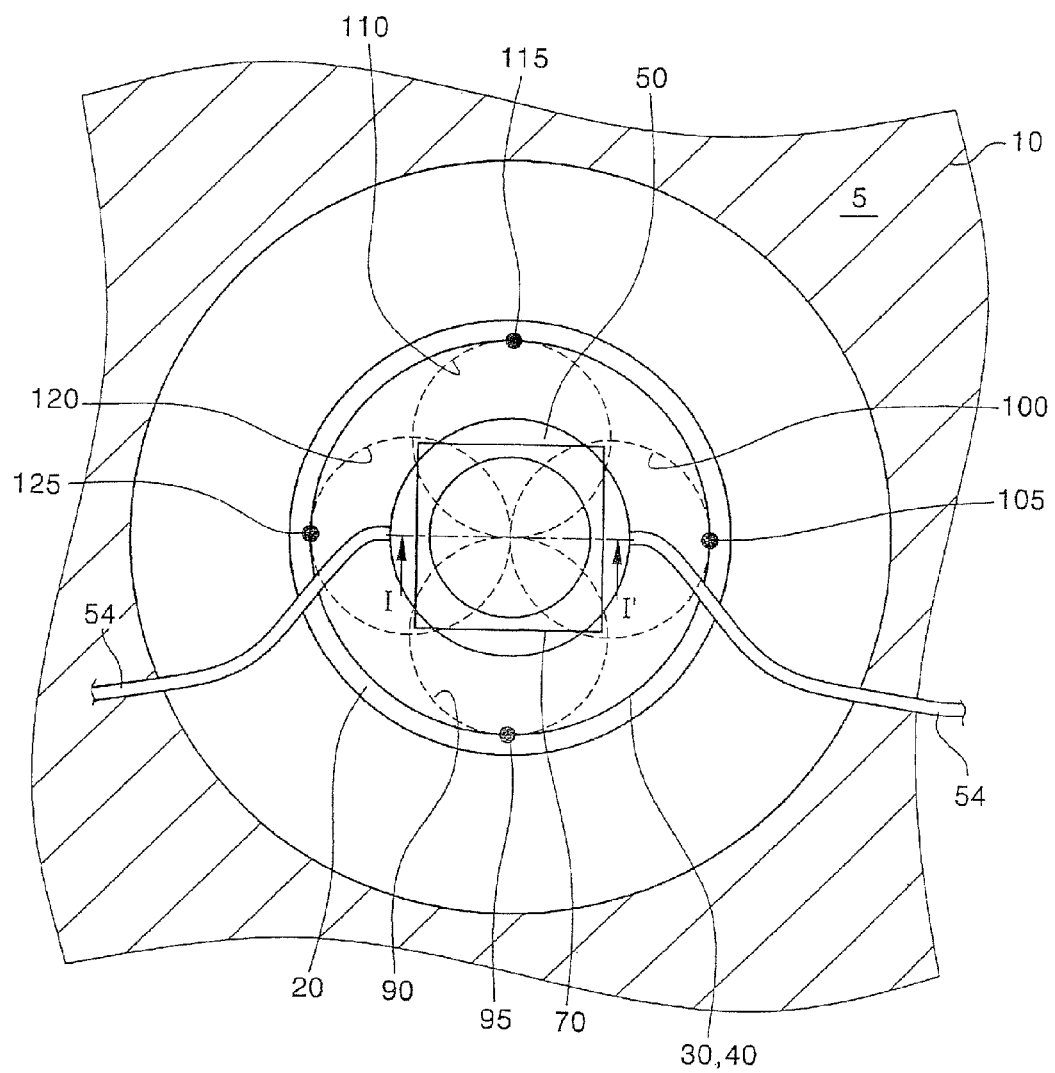
FIG. 2 is a plan view of an immersion lithography apparatus including the monitor or process substrate of FIG. 1.
Figure 3:
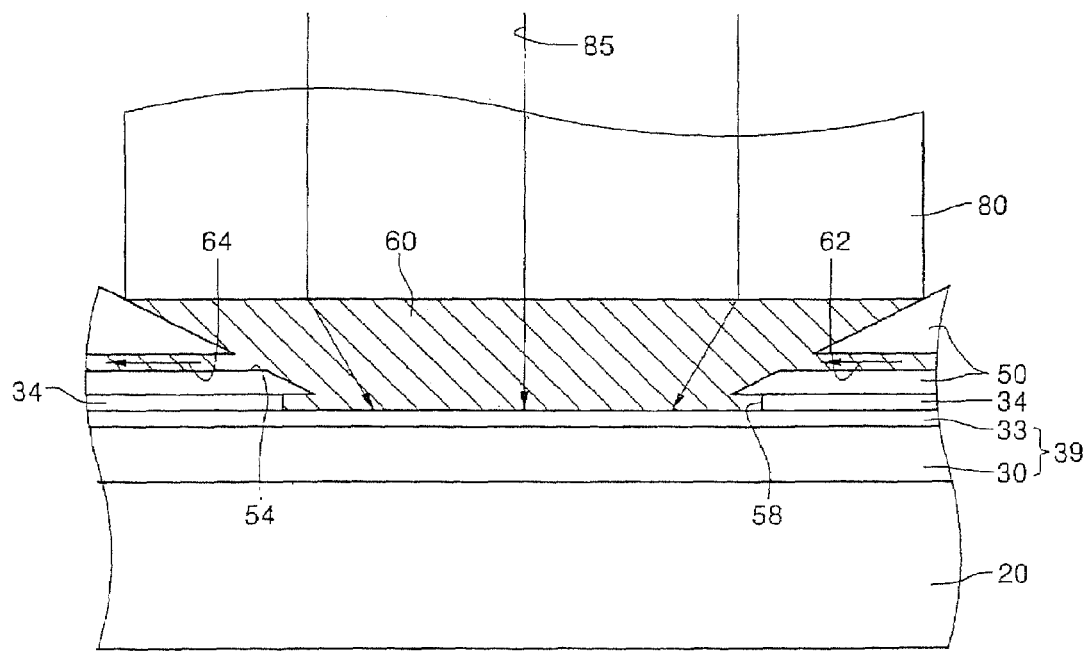
FIG. 3 is a cross-sectional view taken along line I-I' of FIG. 2, which illustrates methods of performing a pre-immersion lithography process according to an embodiment of the invention.

FIG. 2 is a plan view of an immersion lithography apparatus including the monitor or process substrate of FIG. 1, and FIG. 3 is a cross-sectional view taken along line I-I' of FIG. 2, which illustrates a method of performing a pre-immersion lithography process.

Referring to FIGS. 2 and 3, methods of performing pre-immersion lithography processes according to some embodiments of the present invention may include those using the immersion lithography apparatus 5 of FIG. 2. The immersion lithography apparatus 5 may include a substrate stage 10, a substrate chuck 20, a reservoir 50 and a pattern-transferring system 70. The pattern-transferring system 70 may be on the reservoir 50. The pattern-transferring system 70 may include a photo mask and optical lenses above and beneath the photo mask. The reservoir 50 may be on the substrate chuck 20. The reservoir 50 may contain an immersion liquid 60, as shown in FIG. 3. Additionally, the substrate chuck 20 may be surrounded by the substrate stage 10, and the substrate chuck 20 may move up/down and left/right.

According to some embodiments of the present invention, the gettering member 39 of FIG. 1 may be placed on the substrate chuck 20 of the immersion lithography apparatus 5. The gettering member 39 may be between the reservoir 50 and the substrate chuck 20. The gettering member 39 may include a monitor substrate 30 and a conditioning layer 33 thereon. Subsequently, the immersion lithography apparatus 5 may be driven. Here, the substrate chuck 20 may hold the gettering member 39 in place. The immersion lithography apparatus 5 may fill the reservoir 50 with the immersion liquid 60, as illustrated in FIG. 3. The immersion liquid 60 may be introduced into the reservoir 50 through a pipe 54 of the reservoir 50. As such, the immersion liquid 60 may flow into the reservoir 50 along a flow line 62 through into one side of the reservoir 50, and then flow out of the reservoir 50 along a flow line 64 through the other side thereof after passing through the reservoir 50. As a result, the flow of the immersion liquid 60 through the pipe 54 and the reservoir 50 may remain constant and the reservoir 50 may fill with the immersion liquid 60.

According to some embodiments of the present invention, the immersion liquid 60 may have a lower temperature than the substrate chuck 20 prior to entering the reservoir 50. The immersion liquid 60 may include a liquid that does not react with the conditioning layer 33 and that has a higher refractive index than air 34. In particular embodiments, the immersion liquid 60 may include deionized water. According to some embodiments of the present invention, the gettering member 39 may be in contact with the immersion liquid 60 in the reservoir 50, as shown in FIG. 3, while the immersion liquid 60 is continuously supplied into the reservoir 50. Exposing radiation 85 may also sequentially pass through the pattern-transferring system 70 and the immersion liquid 60 onto the gettering member 39. During such a pre-immersion lithography process, the immersion lithography apparatus 5 may move the substrate chuck 20, e.g., left and right and leave, e.g., first to fourth traces 90, 100, 110 and 120 of the immersion liquid 60 on the gettering member 39, as shown in FIG. 2. The first to fourth traces 90, 100, 110 and 120 of the immersion liquid 60 may be in contact with contact points 95, 105, 115 and 125, respectively, at the edge of the gettering member 39. The first to fourth traces 90, 100, 110 and 120 of the immersion liquid 60 may also be in contact with the substrate chuck 20 off the edge of the gettering member 39.

The first to fourth traces 90, 100, 110 and 120 of the immersion liquid 60 may be formed when the reservoir 50 crosses over the gettering member 39 during the pre-immersion lithography process. As one of skill in the art will understand, the reservoir 50 may make other traces besides the first to fourth traces 90, 100, 110 and 120 on the gettering member 39, as the immersion liquid 60 may be in contact with the entire surface of the gettering member 39. After such a process, the gettering member 39 may be detached from the immersion lithography apparatus 5. Thus, in some embodiments, the pre-immersion lithography process may be completed.

Figure 4:
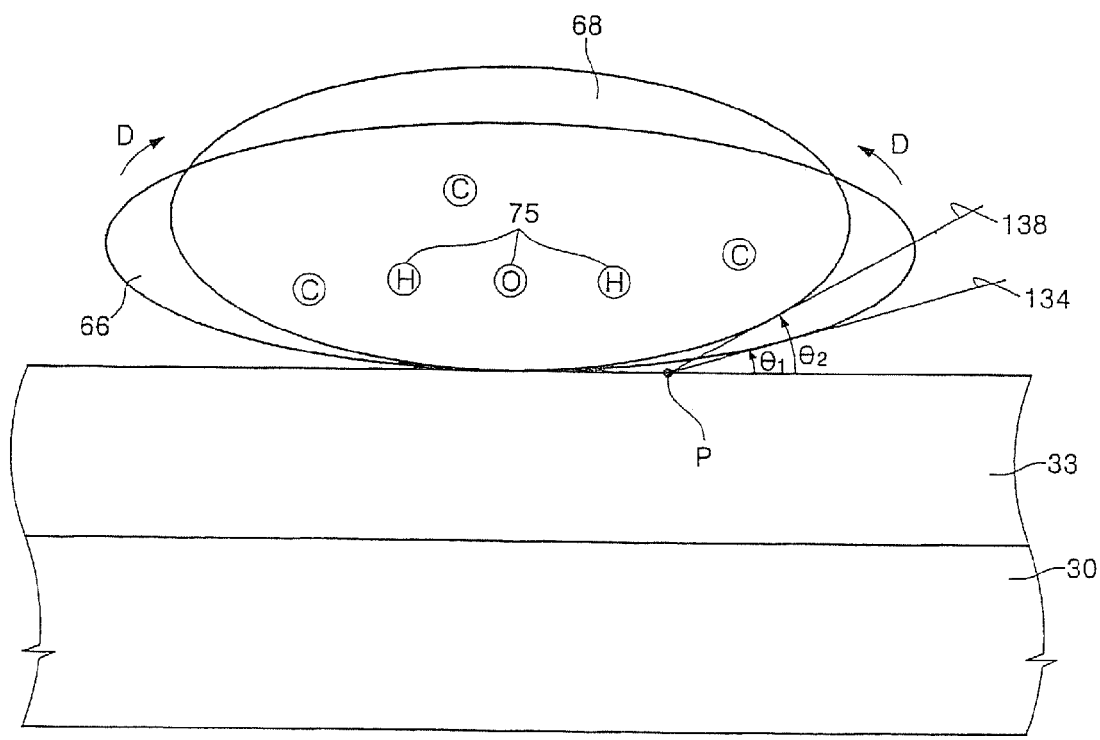
FIG. 4 is a cross-sectional view showing the interaction between a water droplet of an immersion liquid and a conditioning layer according to an embodiment of the invention.
Figure 5:
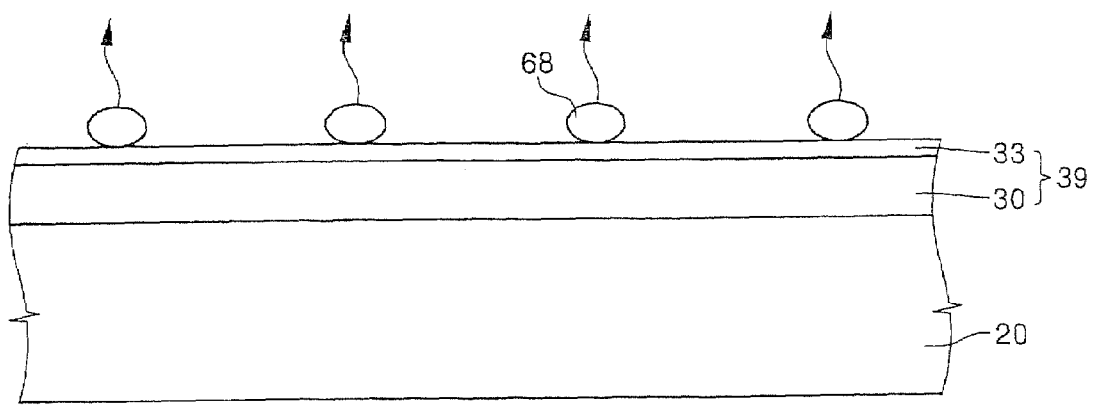
FIG. 5 is a cross-sectional view of water droplets of a immersion liquid on a conditioning layer according to an embodiment of the invention.

FIG. 4 is a cross-sectional view depicting the interaction between a droplet of the immersion liquid 60 with the conditioning layer 33. FIG. 5 is a cross-sectional view of droplets of the immersion liquid 60 on the conditioning layer 33. Furthermore, FIG. 7 is a graph illustrating the variation of the surface tension of water as a function of the ambient temperature of the water.

Figure 7:
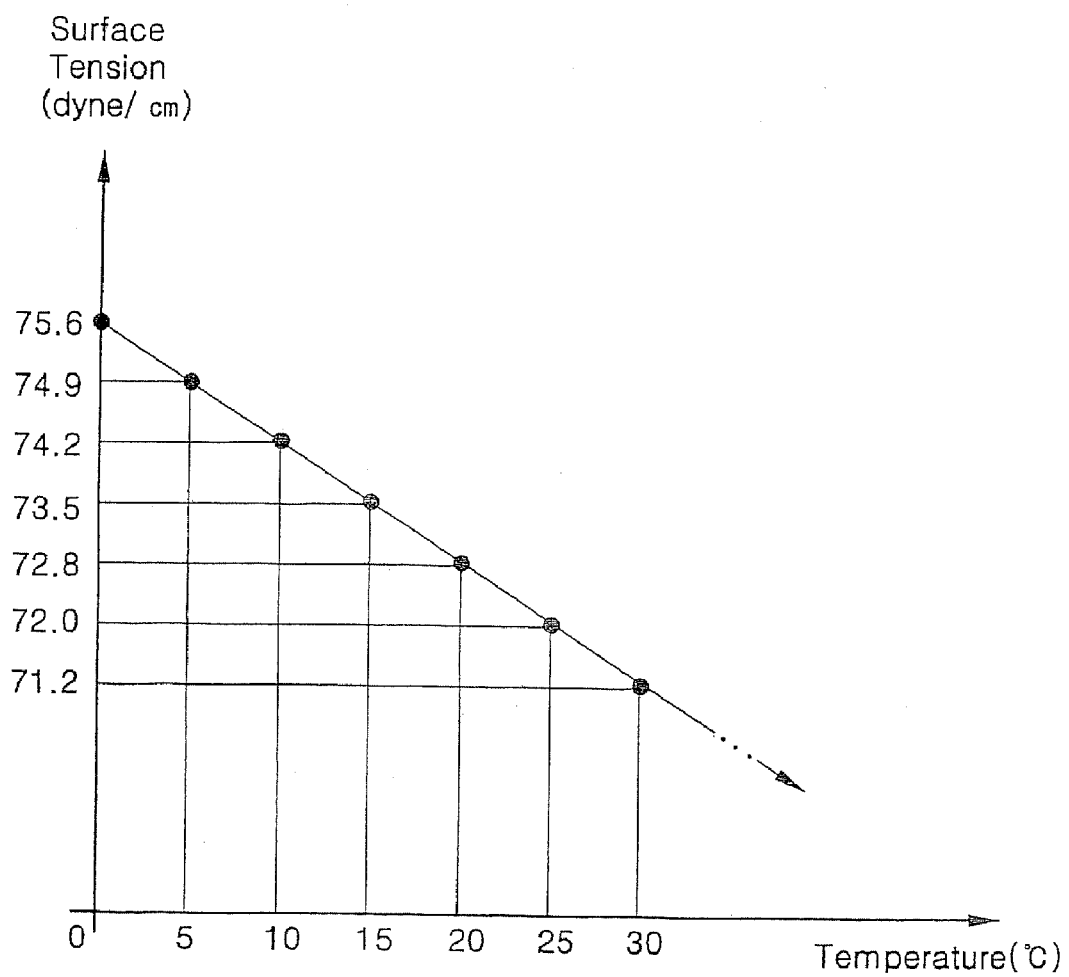
FIG. 7 is a graph illustrating the variation of surface tension as a function of the ambient temperature of an immersion liquid.

Referring to FIGS. 4, 5 and 7, during the pre-immersion lithography process, the immersion liquid 60 may be between the reservoir 50 and the gettering member 39 along an edge of the reservoir 50, as shown in FIG. 3. The immersion liquid 60 may have a boundary 58 in contact with the air 34 between the reservoir 50 and the gettering member 39. As such, the immersion lithography apparatus 5 may create a droplet 66 as shown in FIG. 4 while the first to fourth traces 90, 100, 110 and 120 of the immersion liquid 60 of FIG. 2 are formed at the boundary 58 of the immersion liquid 60. That is, the droplet 66 of the immersion liquid 60 may be formed on the gettering member 39 according to the type of the immersion liquid 60, the type of the conditioning layer 33 and the movement speed of the substrate chuck 20.

According to some embodiments of the present invention, the immersion liquid 60 is water (e.g., deionized water). In some embodiments, the droplets 66 of the immersion liquid 60 may include an organic species C due to the photoresist residues and hydrogen and oxygen atoms 75 that form the water molecules. As FIG. 7 illustrates, the surface tension of the deionized water is a function of the ambient temperature. In fact, FIG. 7 shows that the surface tension of the water decreases by approximately 3.2 dyne/cm when the temperature increases 20° C. As such, the surface tension of the water droplet 66 may vary in response to the surface temperature of the gettering member 39 and the substrate chuck 20 during the pre-immersion lithography process. The water droplet 66 may be in contact with a relatively large surface area of the conditioning layer 33. However, the conditioning layer 33 may include a hydrocarbon compound that does not react with water and may be relatively hydrophobic. As a result, the conditioning layer 33 may not react with the water droplet 66, and there may be a relatively weak interaction between the water droplet 66 and the conditioning layer.

Compared to the interaction of the hydrogen and oxygen atoms 75 on a more hydrophilic surface, the hydrogen and oxygen atoms 75 of the water droplet 66 may have a stronger interaction with each other than with the atoms of the conditioning layer 33. Accordingly, the water droplet 66 on a hydrophobic surface may be morphologically displaced D compared to a water droplet 66 on a more hydrophilic surface, and thus the waterdrop 66 can be deformed into a different waterdrop 68 on the hydrophobic conditioning layer 33, as shown in FIG. 4. The same principle may be true for other relatively hydrophilic immersion liquids 60. Thus, the droplets 66 and 68 of the immersion liquid 60 may have different contact angles $\Theta_1$ and $\Theta_2$, of the tangent lines, 134 and 138, respectively, in contact with the surfaces of the water droplets 66 and 68 about the same point P of the conditioning layer 33. In some embodiments, as shown in FIG. 5, at least one deformed droplet 68 of the immersion liquid 60 may be formed on the conditioning layer 33 through the boundary 58 of the immersion liquid 60 during a pre-immersion lithography process (e.g., the process described with reference to FIG. 3). The deformed droplet 68 may evaporate more readily than the droplet 66 because of the reduced contact area between the conditioning layer 33 and the deformed droplet 68. The deformed droplet 68 of the immersion liquid 60 may also be less likely to adhere to the immersion lithography apparatus 5 during the pre-immersion lithography process.

Additionally, the droplets 66 and 68 of the immersion liquid 60 may include the organic species C due to an immersion lithography process performed prior to the pre-immersion lithography process. That is, during an immersion lithography process performed prior to the pre-immersion lithography process, residues from the photoresist layer may become adhered to the inside of the immersion lithography apparatus 5. The residues of the photoresist layer may cause the organic species C to become included in the droplet 66 of the immersion liquid 60 during the pre-immersion lithography process. The organic species C in the droplet 66 of the immersion liquid 60 may interact with non-polar functional groups and/or molecules in the conditioning layer 33, e.g., via van der Waals forces. The organic species C of the photoresist residues and the conditioning layer 33 both may include non-polar functional groups and/or molecules. Thus, the conditioning layer 33 may attract the organic species C present in the droplet 66 from the photoresist residues.

Figure 8:
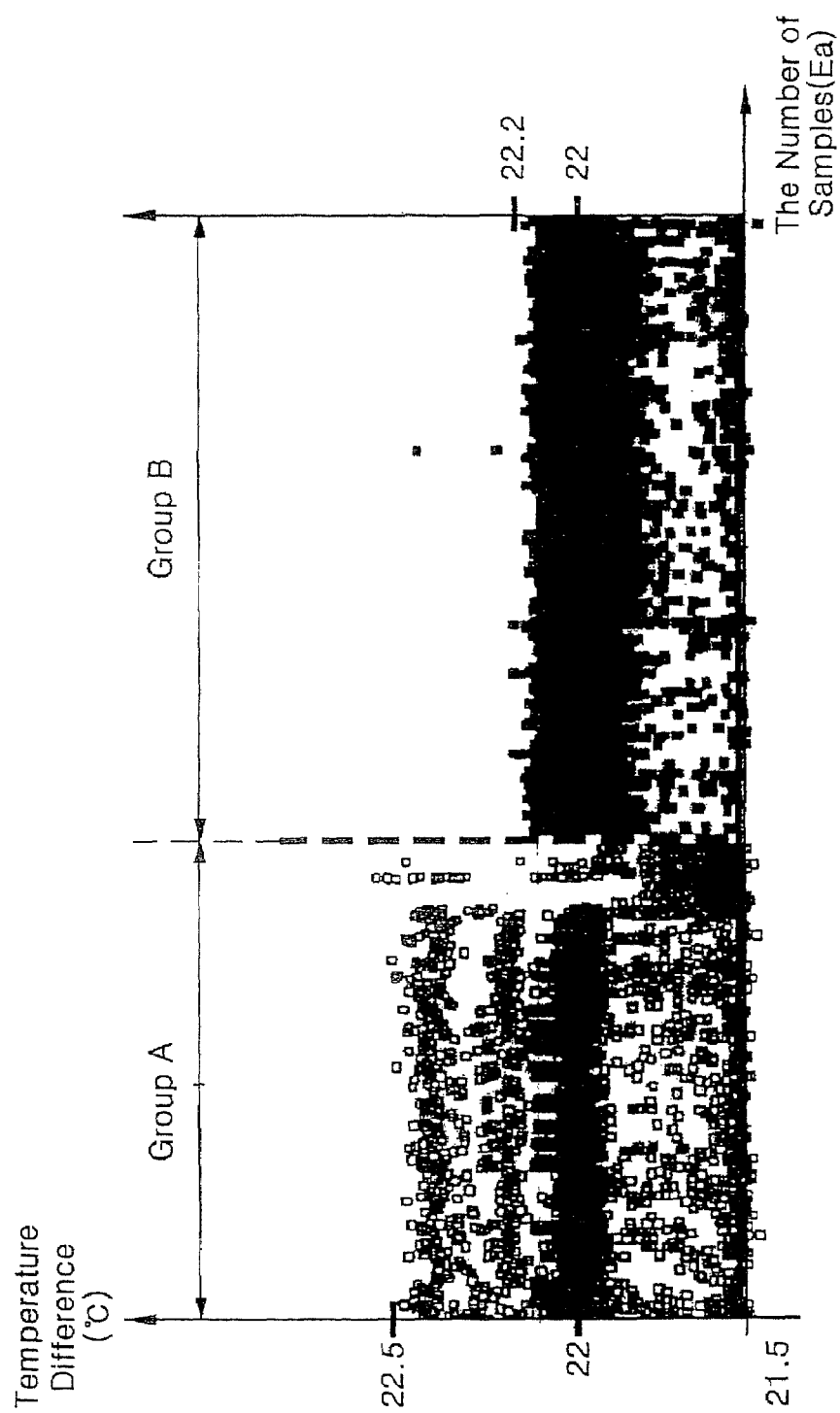
FIG. 8 is illustrates the change in surface temperature of a substrate chuck due to a pre-immersion lithography process.

FIG. 8 is a graph illustrating the change in the surface temperature of a gettering member 39 due to the pre-immersion lithography process described with reference to FIG. 3.

Referring to FIG. 8, the change in the surface temperature of the gettering member 39 due to the pre-immersion lithography process was measured on respective days. The change in the surface temperature of the gettering member 39 due to the pre-immersion lithography process refers to the value obtained by subtracting the surface temperature of the gettering member 39 after the pre-immersion lithography process from the surface temperature of the gettering member 39 before the pre-immersion lithography process (before the gettering member 39 is put into the immersion lithography apparatus 5). The change in surface temperature of the gettering member 39 due to the pre-immersion process compared to the change in surface temperature of a conventional dummy layer due to the same process is illustrated in FIG. 8. In FIG. 8, Group A identifies the temperature change measurements for a plurality of conventional dummy layers that include single-crystalline silicon with a native oxide layer thereon. Group B identifies the temperature change measurements for a plurality of gettering members 39 that include a monitor substrate 30 and a conditioning layer 33 thereon. The pre-immersion lithography process was performed under the same conditions for the Group A and the Group B samples.

As can be seen in FIG. 8, the surface temperature difference due to the pre-immersion lithography process was greater on average for the conventional dummy layers than for the gettering members 39. More specifically, the surface temperature difference due to the pre-immersion lithography process when conventional dummy layers were used was 22° C. on average and varied within a range of ±0.5° C. from the average. The surface temperature difference due to the pre-immersion lithography process when the gettering members 39 were used was 22° C. on average and varied within a range of −0.5° C. to +0.2° C. from the average. Thus, the surface temperature difference due to the pre-immersion process were less when gettering members 39 were used than when conventional dummy layers were used.

As described above, the conventional dummy layers of Group A include a native oxide layer irregularly formed on single-crystalline silicon dummy substrates. Thus, a droplet 66 of the immersion liquid 60 of FIG. 4 may have a stronger interaction with the relatively hydrophilic native oxide layers than with the relatively hydrophobic dummy substrates. The stronger interaction of the immersion liquid 60 with the native oxide layers may be the reason for the greater surface temperature difference when the dummy layers of Group A were used relative to the surface temperature difference when the gettering members of Group B were used. The gettering members 39 of Group B include conditioning layers 33 of a predetermined thickness on the surface of the monitor substrates 30. Since the deformed droplet 68 of the immersion liquid 60 of FIG. 4 may not have as strong of interaction with the relatively hydrophobic conditioning layers 33 of the gettering members 39 as with the conventional dummy layers, the surface temperature difference due to the pre-immersion lithography process may be less for the samples in Group A than for the samples in Group B. As a result, the gettering members 39 of Group B may maintain the surface temperature of the substrate chuck 20 at a more constant temperature during and after the pre-immersion lithography process compared to the conventional dummy layers of Group A, and thus the gettering members 39 of Group B may stabilize the process environment in the immersion lithography apparatus 5 compared to the conventional dummy layers of group A.

Figure 9:
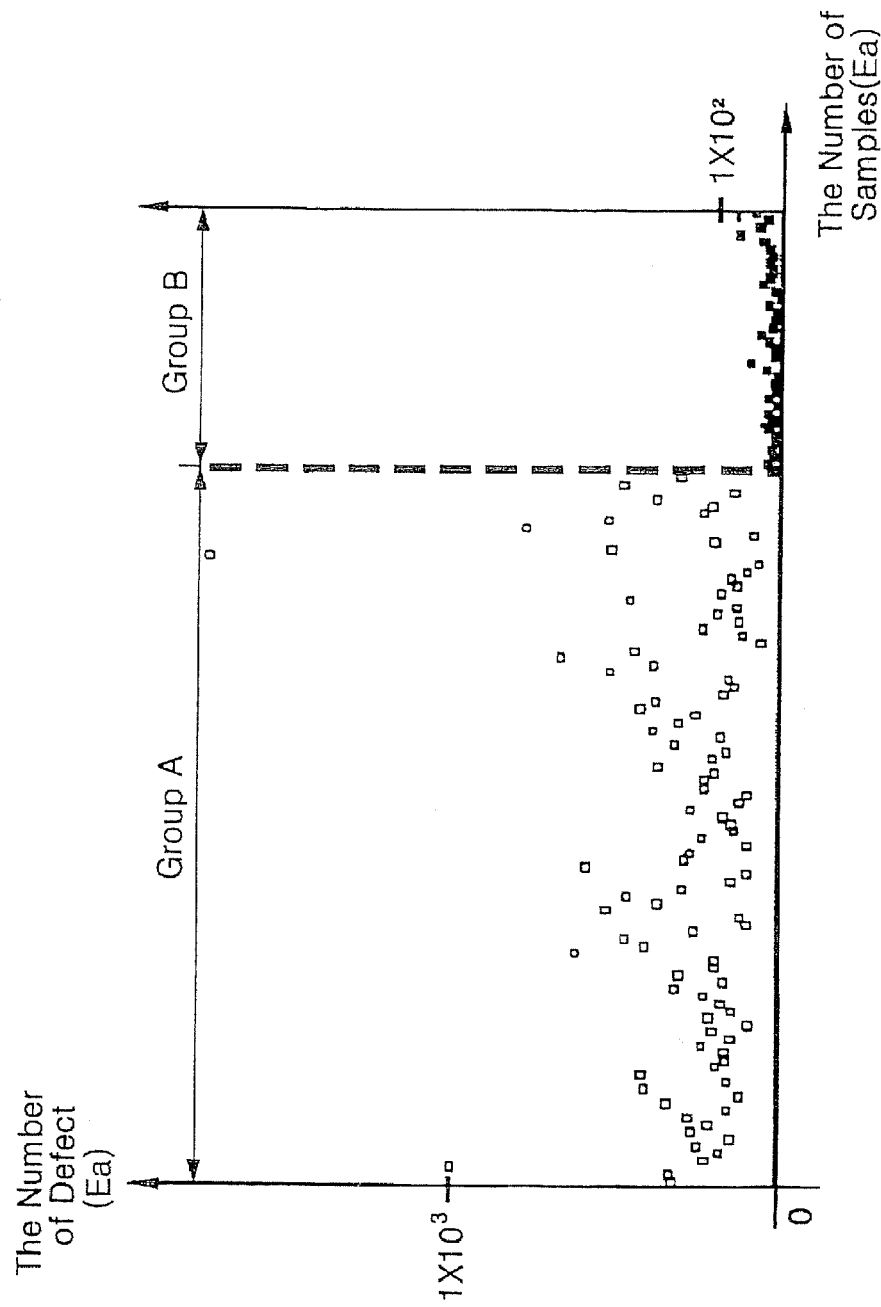
FIG. 9 is a graph illustrating the number of defects generated on a monitor substrate after a pre-immersion lithography process.

FIG. 9 is a graph indicating the number of defects generated on a monitor substrate after the pre-immersion lithography process described with reference to FIG. 3.

Referring to FIG. 9, pre-immersion lithography processes were performed on respective days, and then the number of defects of a plurality of conventional dummy layers (Group A), all of which included a dummy substrate of single-crystalline silicon and a native oxide layer thereon, and a plurality of gettering members 39 (Group B), all of which included the monitor substrate 30 and the conditioning layer 33 thereon, were counted after each pre-immersion lithography process. The pre-immersion lithography process was performed twice each day. Here, the number of defects due to the first pre-immersion lithography process for both the conventional dummy layers of Group A and the gettering members 39 of Group B was ignored. Only the defects of the conventional dummy layers of Group A and the gettering members 39 of Group B from the second pre-immersion lithography process were counted. Two gettering members 39 were used to correspond to the first and second pre-immersion lithography processes. Here, the number of defects is defined as the total sum of the defects of the conventional dummy layer or the gettering member 39 after the second pre-immersion lithography process. Here, the first and second pre-immersion lithography processes were performed on the samples of Groups A and the samples of Group B under the same conditions.

As seen in FIG. 9, the conventional dummy layers of Group A may have 1000 or more defects after the second pre-immersion lithography process. In contrast, the gettering members 39 of Group B may have 100 or less defects after the second pre-immersion lithography process. The difference in defects of Groups A and B may be explained by the noting that defects may be obtained as a result of the photoresist residues. While not wishing to be bound to any particular theory, it appears that the conventional dummy layers of Group A are not as capable of capturing the organic species of the photoresist residues as the gettering members 39. The silicon and oxygen atoms of the conventional dummy layer may not strongly interact with organic species of the photoresist residues via Van der Waals forces. Moreover, since the native oxide layer is relatively hydrophilic, it is likely that the droplet 66 of the immersion liquid 60 may deposit on the immersion lithography apparatus 5 during the pre-immersion lithography process. In contrast, it is believed that the conditioning layer 33 of the gettering members 39 of Group B may be able to capture at least some of the organic species of the photoresist layer. The non-polar compounds in the conditioning layer 33 may interact with organic species C of the photoresist residues via Van der Waals forces. Moreover, since the conditioning layer 33 is relatively hydrophobic, it is less likely that the droplet 68 of the immersion liquid 60 will deposit on the immersion lithography apparatus 5 during the pre-immersion lithography process. Thus, the use of the gettering members 39 of Group B may stabilize the environment of the immersion lithography apparatus after the pre-immersion lithography process.

Figure 10:
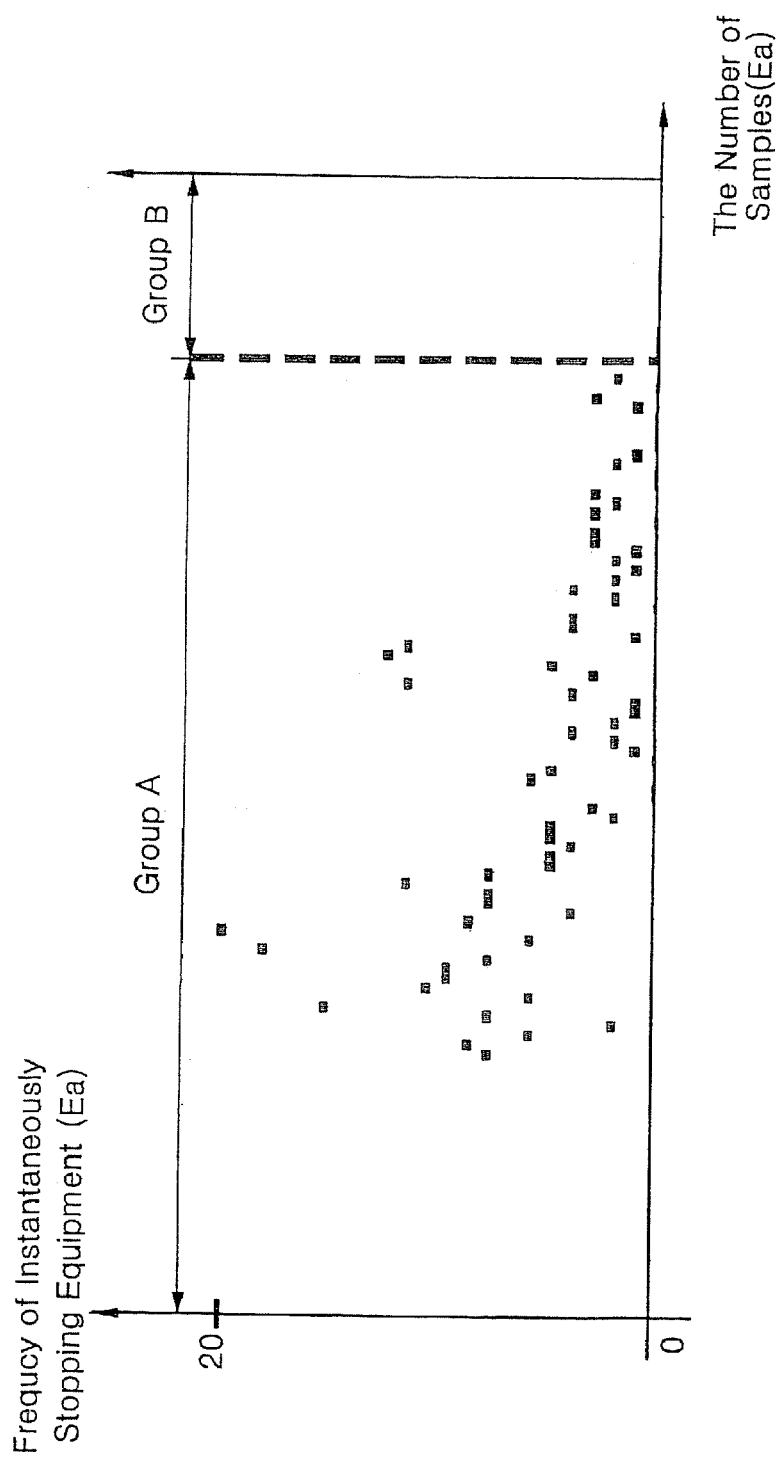
FIG. 10 is a graph illustrating the frequency of instantaneous stopping of an immersion lithography apparatus after a pre-immersion lithography process.

FIG. 10 is a graph illustrating the frequency of instantaneous stopping of an immersion lithography apparatus after the pre-immersion lithography process described with reference to FIG. 3 was performed.

Referring to FIG. 10, the pre-immersion lithography process was repeatedly performed on respective days, and then the frequency of instantaneous stopping of the immersion lithography apparatus 5 of FIG. 2 was counted. The frequency of instantaneous stopping of the immersion lithography apparatus 5 is defined as the total sum of the number of operation errors occurring in the immersion lithography apparatus 5 during the measurement period. The operation error of the immersion lithography apparatus 5 represents a case where the equipment is beyond at least one of equipment specifications for managing the equipment. The frequency of instantaneous stopping of the immersion lithography apparatus 5 is shown in the graph of FIG. 10. In the graph of FIG. 10, each of the samples in the plurality of samples in Group A included a conventional dummy layer having a dummy substrate of single-crystalline silicon and a native oxide layer thereon. Each of the plurality of samples in Group B included the gettering member 39 having the monitor substrate 30 and the conditioning layer 33 thereon. Here, the pre-immersion lithography process was performed on the samples of Groups A and samples of Groups B under the same condition.

The samples that included the conventional dummy layer (Group A) exhibited a frequency of instantaneous stopping of a maximum of 20 times per sample. The samples that included the gettering member 39 (Group B) exhibited a frequency of instantaneous stopping of 1 time or less. When comparing these two groups, in the samples of Group A, since the droplet 66 of the immersion liquid 60 of FIG. 4 may have relatively strong interactions with the relatively hydrophilic native oxide layer, there is a strong probability that the water droplet 66 of the immersion liquid 60 may move, which may result in the malfunction of sensors in the immersion lithography apparatus 5. For example, the droplet 66 of the immersion liquid 60 may move to the sensors of the immersion lithography apparatus 5 from the conventional dummy layer, resulting in the malfunction of at least one sensor of the immersion lithography apparatus 5. In Group B, since the droplet 68 of the immersion liquid 60 may not strongly interact with the conditioning layer 33 during the pre-immersion lithography process, there is a lower probability that the waterdrop 68 of the immersion liquid 60 will move, which may result in normal function of the sensors in the immersion lithography apparatus 5. Thus, the gettering members of Group B may stabilize the process environment in the immersion lithography apparatus 5 compared to the conventional dummy layers of group A.

Methods of performing immersion lithography processes according to embodiments of the present invention may include preparing substrate cases. Each substrate case may have several process substrates 40, as depicted in FIG. 1. In some embodiments, the process substrate 40 may be formed of single-crystalline silicon, poly-crystalline silicon, amorphous silicon, silicon oxide or any combinations thereof. In some embodiments, the process substrate 40 may be formed by CVD, PVD, ALD or any combination thereof. The process substrate 40 may or may not be conductive, and in some embodiments, the process substrate 40 may be partially conductive.

Figure 6:
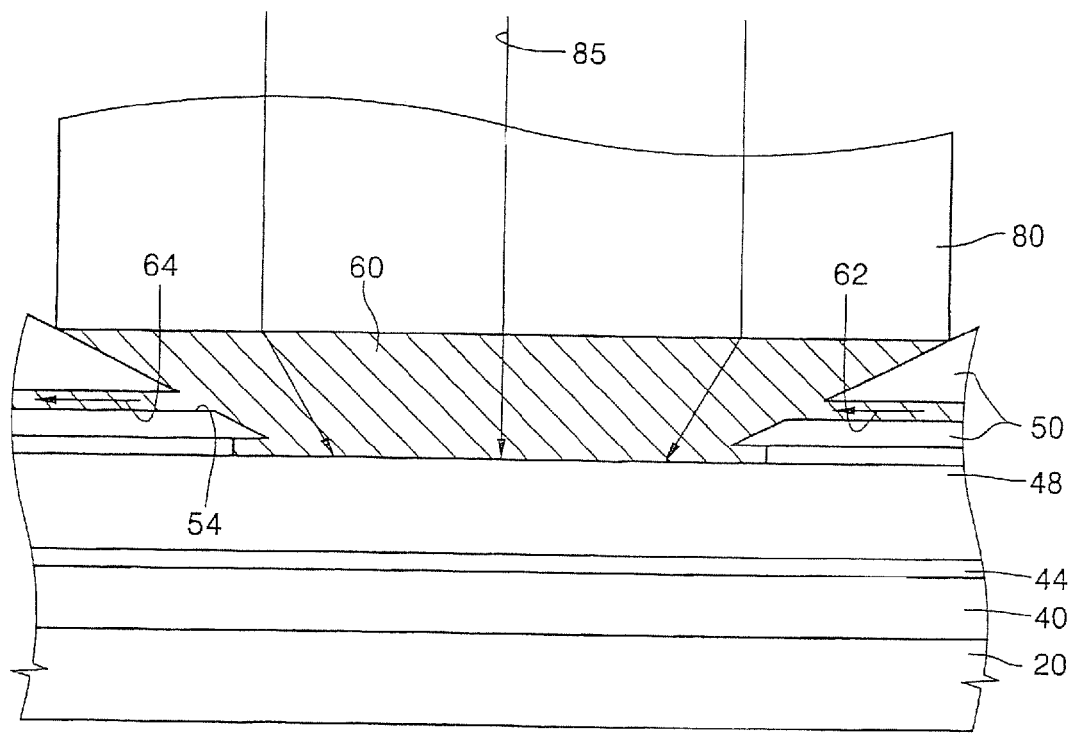
FIG. 6 is a cross-sectional view taken along line I-I' of FIG. 2, which illustrates methods of performing an immersion lithography process according to an embodiment of the invention.

According to some embodiments of the present invention, one of the substrate cases is selected. Adhesive layer 44 of FIG. 1 may be formed on the process substrates 40 of the selected substrate case, respectively. In particular embodiments, the adhesive layers 44 may include HMDS. In some embodiments, the adhesive layers 44 may include a fluorinated or non-fluorinated polymer, and in some embodiments, the adhesive layers 44 may include a compound that is in the conditioning layer 33 of FIG. 1. Photoresist layers 48 of FIG. 1 may be formed on the adhesive layers 44. The adhesive layer 44 may function to increase adhesion of the photoresist layer 48 to the process substrate 40. A selected process substrate 40 of the selected substrate case may be placed on the substrate chuck 20 of the immersion lithography apparatus 5 of FIG. 2 and subjected to an exposure step of an immersion lithography process. As such, the photoresist layer 48 of the selected process substrate 40 may be under a reservoir 50 as shown in FIG. 6. Furthermore, the substrate chuck 20 may hold the selected process substrate thereon. The immersion lithography apparatus 5 may then be driven.

In the immersion lithography apparatus 5, the reservoir 50 may be filled with an immersion liquid 60 as shown in FIG. 6. The immersion liquid 60 may be introduced into the reservoir 50 through a pipe 54. That is, the immersion liquid 60 may flow into the reservoir 50 along flow line 62 and flow out of the reservoir 50 along flow line 64. Thus, in the immersion lithography apparatus 5, the flow of the immersion liquid 60 through the pipe 54 and the reservoir 60 may be remain constant, thereby filling the reservoir 50 with the immersion liquid 60. In some embodiments, the immersion liquid 60 may include a liquid that does not react with the conditioning layer 33 and has a higher refractive index than air. According to particular embodiments of the present invention, the immersion liquid 60 may include water (e.g., deionized water).

Referring again to FIG. 6, the immersion lithography apparatus 5 may continuously provide the immersion liquid 60 to the reservoir 50 such that the immersion liquid may be in contact with the photoresist layer 48 on the selected process substrate 40. Furthermore, exposing radiation 85 may sequentially passing through the pattern-transferring system 70 and the immersion liquid 60 to the photoresist layer 48. The immersion lithography apparatus 5 may leave traces, such as first to fourth traces 90, 100, 110 and 120, of the immersion liquid 60 on the selected process substrate 40 due to the moving of the substrate chuck 20 (e.g., left and right) during the immersion lithography process as shown in FIG. 2.

More specifically, the immersion lithography apparatus 5 may form image patterns on the photoresist layer 48 using the exposing radiation 85 while drawing the first to fourth traces 90, 100, 110 and 120 of the immersion liquid 60 on the photoresist layer 48. The image patterns on the photoresist layer 48 may be formed by transferring the photo mask patterns of the pattern-transferring system 70 to the photoresist layer 48 using the exposing radiation 85 from the immersion lithography apparatus 5. After the transfer of the exposing radiation 85 to the photoresist layer 48, the selected process substrate 40 may be detached from the immersion lithography apparatus 5 to complete the exposure step of the immersion lithography process. Then, other process substrates 40 may be individually selected from the selected substrate case, and the exposure step of the immersion lithography process may be respectively performed on the other process substrates 40.

After the exposure step in the immersion lithography process for the process substrates in the selected substrate case, the immersion lithography apparatus 5 may perform a post-immersion lithography process. The post-immersion lithography process may include: placing the gettering member 39 of FIG. 1 on the substrate chuck 20; filling the reservoir 50 with the immersion liquid 60; passing exposing radiation 85 through the pattern-transferring system 70 to the surface of the gettering member 39 and contacting the immersion liquid 60 with the surface of the gettering member 39; and detaching the gettering member 39 from the substrate chuck 20. This process may be repeated as necessary. Alternatively, the post-immersion lithography process may include: placing the gettering member 39 of FIG. 1 on the substrate chuck 20; filling the reservoir 50 with the immersion liquid 60; contacting the immersion liquid 60 with the surface of the gettering member 39; and detaching the gettering member 39 from the substrate chuck 20. This process may also be repeated as necessary.

Subsequently, the immersion lithography apparatus 5 may perform the exposure steps in the immersion lithography process for other substrate cases. In some embodiments, the respective exposure steps of the immersion lithography processes may be performed under the same conditions as those used for the photoresist layer 48 of the selected process substrate 40. Additionally, the immersion lithography apparatus 5 may perform a post-immersion lithography process between the immersion lithography exposure steps of the other substrate cases.

Figure 11:
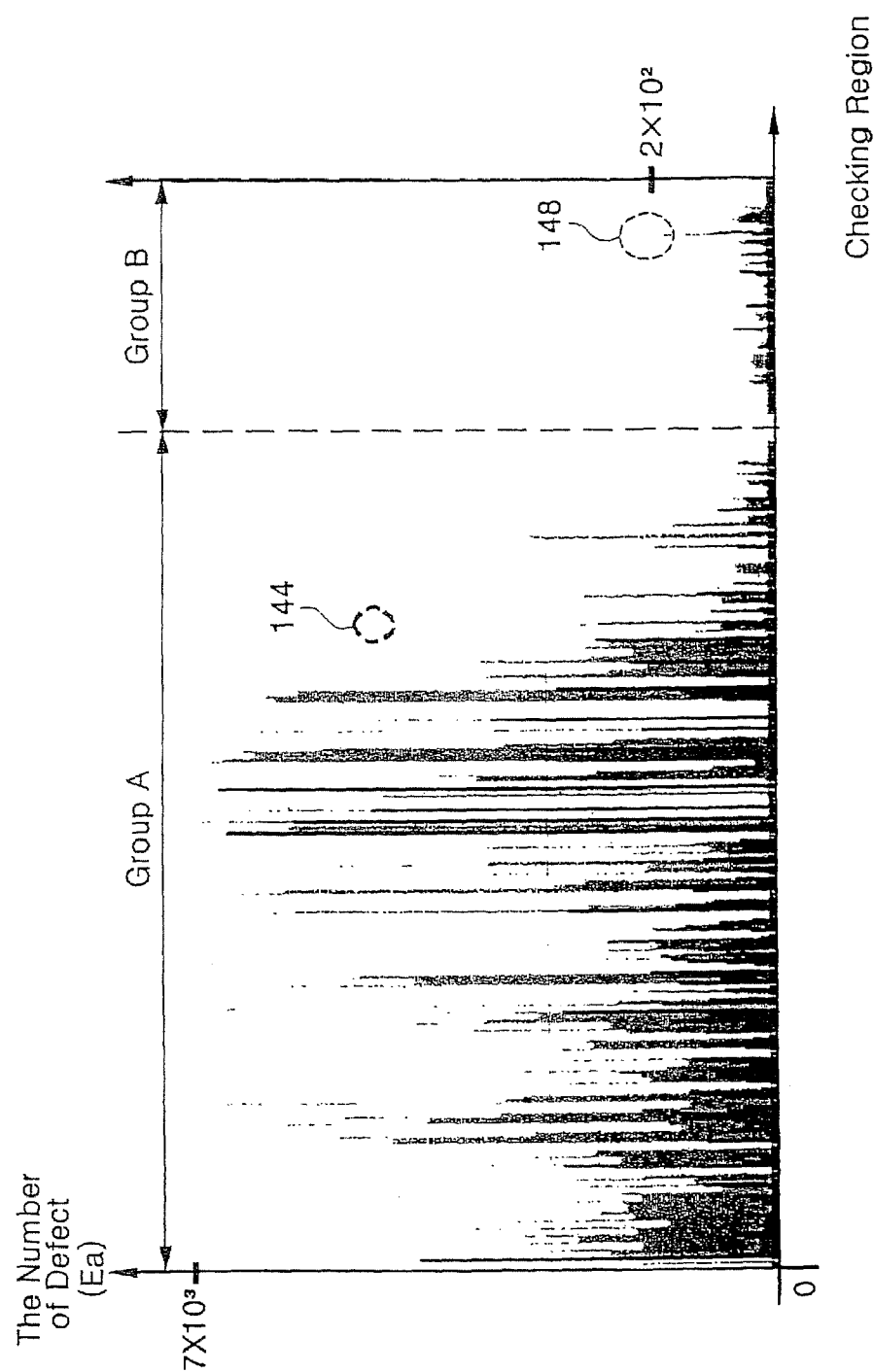
FIG. 11 is a graph illustrating the number of defects to process substrates after a pre-immersion lithography process and an immersion lithography process.

FIG. 11 is a graph indicating the number of defects generated by a process substrate after a pre-immersion lithography process such as that described with reference to FIG. 3 and an immersion lithography process described with reference to FIG. 6.

Referring to FIG. 11, the samples of Group A include process substrates 40 wherein a conventional dummy layer having a dummy substrate of single-crystalline silicon and a native oxide layer thereon was used to perform the pre-immersion lithography process. The samples of Group B include process substrates 40 wherein a gettering member 39, which includes the monitor substrate 30 and the conditioning layer 33 thereon, was used to perform the pre-immersion lithography process. The pre-immersion lithography process was performed on the samples of Groups A and B under the same conditions. The immersion lithography process was performed on the samples of Groups A and B using a plurality of process substrates 40 under the same conditions.

For each of the samples in Group A and B, the immersion lithography process described with reference to FIG. 6 was performed on two consecutive days, and then the number of defects on the process substrates 40 were ascertained. The process substrates 40 include adhesive layer 44 and the photoresist layer 48, sequentially stacked. A pre-immersion lithography process was followed by the immersion lithography process. Here, the number of defects, which is the total sum of the defects of the process substrates 40, was ascertained after the immersion lithography process. The number of defects on the process substrates 40 are illustrated in FIG. 11.

When the pre-immersion lithography process was performed using the conventional dummy layer as in Group A, photoresist residues from the pre-immersion lithography process remained on the process substrate 40. The photoresist residues in the Group A caused as many as 7000 defects. When the pre-immersion lithography process was performed using the gettering member 39 as in Group B, photoresist residues from the pre-immersion lithography process and the immersion lithography process also remained on the process substrate 40. However, here the photoresist residues only resulted in a maximum of 200 defects.

Figure 12:
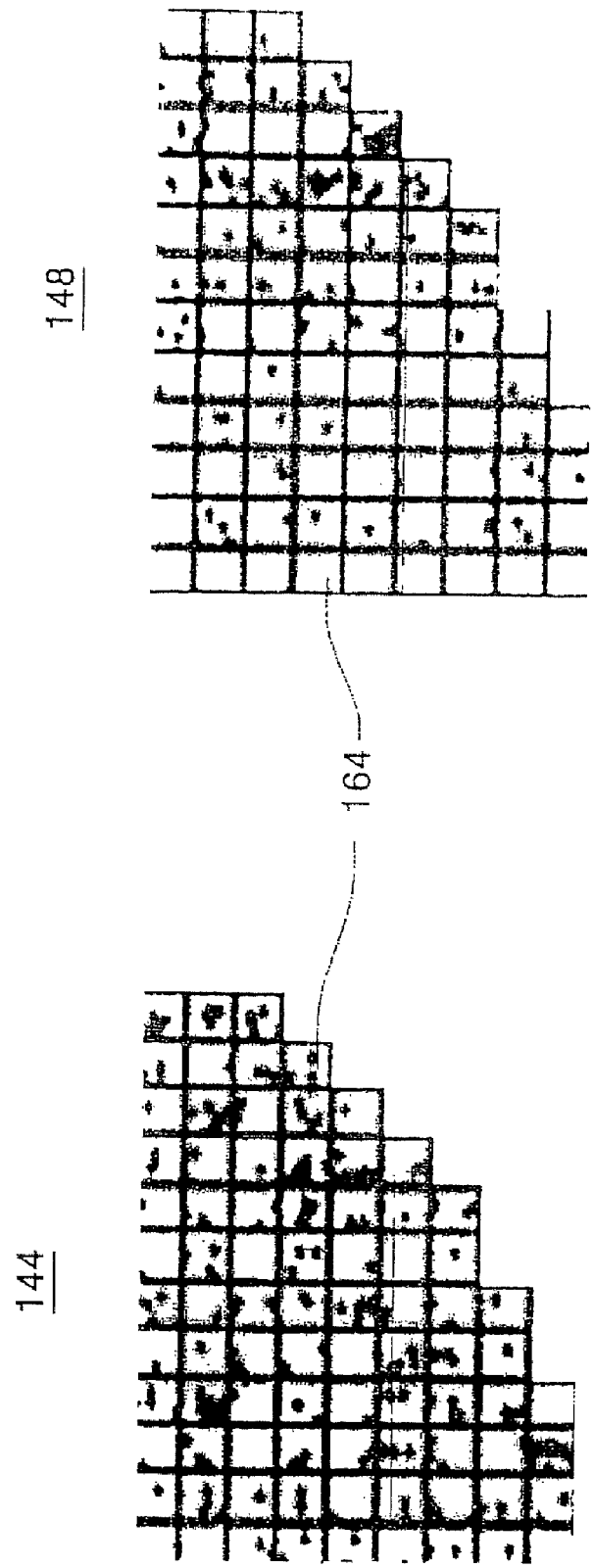
FIG. 12 is a substrate map showing a selected region of the process substrates shown in FIG. 11.
Figure 13:
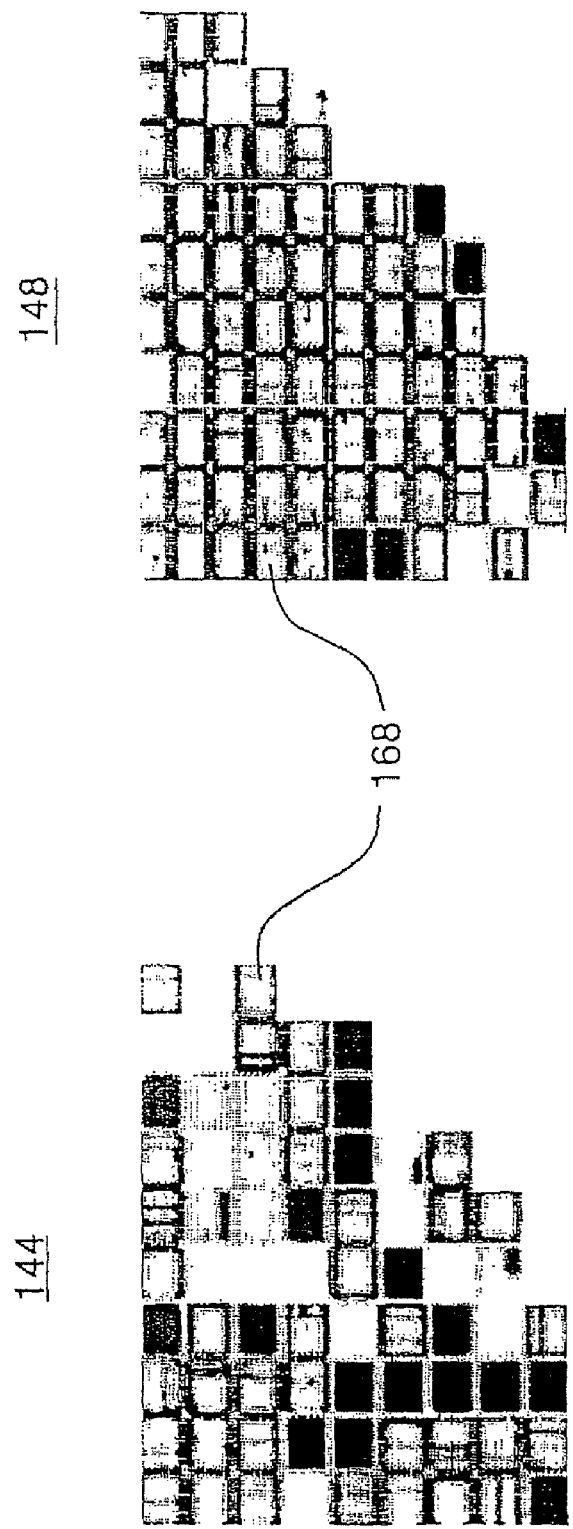
FIG. 13 is a yield map showing the process yield in a selected region of the process substrates shown in FIG. 11.

FIG. 12 is a substrate map showing a selected region of the process substrate of FIG. 11, and FIG. 13 is a yield map showing process yields for the selected region of a process substrate of FIG. 11.

Referring to FIGS. 12 and 13, two process substrates, 144 and 148, illustrated in FIG. 11 were selected, and substrate maps corresponding to the selected regions of the substrates 144 and 148 were prepared as shown in FIG. 12. The process substrates 144 and 148 each include a plurality of semiconductor chip formation regions 164 in the selected regions. The substrate maps show distributions of defects in the selected regions of the process substrates 144 and 148, respectively, after the pre-immersion and immersion lithography processes. Here, the process substrate 144 (from the Group A of FIG. 11) includes defects over the entire selected region thereof. The defects in the process substrate 144 of Group A does not appear to be repetitive, and it may be shown through the exposure step of the immersion lithography process. As such, the defects in the process substrates 144 of Group A may be due to photoresist residues. In contrast, the process substrate 148 (from Group B in FIG. 11) has more defects on the edge of the selected region thereof. The group of defects may also be repetitive, and it may be shown through the exposure step of the immersion lithography process. Furthermore, the process substrate 148 in the Group B has an irregular distribution of defects in the selected region thereof.

After performing the semiconductor fabrication processes on the process substrates 144 and 148 from the Groups A and B, respectively, process yields for the process substrates 144 and 148 were ascertained, as in shown FIG. 13. Semiconductor fabrication processes may include photolithography processes (e.g., immersion lithography and non-immersion lithography processes), etching processes and deposition processes. Accordingly, through such semiconductor fabrication processes, the semiconductor chip formation regions 164 of FIG. 12 may be formed into semiconductor chips 168 of FIG. 13. The process yields may be displayed using yield maps obtained from the process substrates 144 and 148 of FIG. 12, respectively. In the yield maps, the semiconductor chips 168 which electrically malfunction and do not contribute to the process yield are black. The semiconductor chips 168 which function properly electrically and contribute to the process yield are white. When comparing Group A with Group B, the process substrate 148 of Group B has more semiconductor chips that contribute to the process yield than the process substrate 144 of Group A.

As described above, the present invention provides gettering members, methods of forming the same and methods of performing immersion lithography processes using the same. Before performing an immersion lithography process, photoresist residues in an immersion lithography apparatus may be removed using a gettering member according to an embodiment of the invention. Such removal of photoresist residues may result in the increase of the number of semiconductor chips that can be obtained from a process substrate. Additionally, gettering members according to embodiments of the invention and methods of using the same may increase the life-span of an immersion lithography apparatus and lower the fabrication costs of semiconductor chips.

Moreover, the present invention is not limited to immersion lithography processes or apparatuses. The invention may be also be applied to typical photolithography processes, which are well known to those skilled in the art, that are performed using semiconductor manufacturing equipment. Here, semiconductor fabrication apparatuses include wet etching apparatuses or a dry photolithography apparatuses.

The present invention is also not limited to photolithography using a photoresist layer. The present invention may be applied to a semiconductor cleaning processes in which a material layer may be formed on a process substrate using an apparatus for a method such as chemical vapor deposition, physical vapor deposition, atomic layer deposition, or any combinations thereof, each of which is well known to those skilled in the art. In some embodiments, residues formed on such apparatuses may be removed using a gettering member according to an embodiment of the invention. Thus, the present invention may be easily modified to be used in other semiconductor fabrication equipment or semiconductor cleaning processes.

Exemplary embodiments of the present invention have been disclosed herein and, although specific terms are employed, they are used and are to be interpreted in a generic and descriptive sense only and not for purposes of limitation. Accordingly, it will be understood by those of ordinary skill in the art that various changes in form and details may be made without departing from the spirit and scope of the present invention as set forth in the following claims.

What is claimed is:

1. A method of performing an immersion lithography process comprising
    (a) providing a gettering layer, comprising a monitor substrate and a conditioning layer thereon, between a substrate chuck and an immersion liquid reservoir of an immersion lithography apparatus, wherein the conditioning layer comprises hexamethyldisilazane;
    (b) filling the immersion liquid reservoir with an immersion liquid, thereby contacting the immersion liquid with a surface of the gettering layer;
    (c) removing the gettering layer from the substrate chuck;
    (d) providing a process substrate having a photoresist thereon to the substrate chuck; and
    (e) exposing the photoresist to radiation through a pattern transferring system.

2. The method according to claim 1, wherein the conditioning layer further comprises at least one fluorinated compound selected from the group consisting of perfluoroacetate, hexafluoroalcohol and polytetrafluoroethylene.

3. The method according to claim 1, wherein the conditioning layer further comprises at least one non-fluorinated polymer selected from the group consisting of acrylate, metaacrylate, polynorbornene, polystyrene, polyethylene, polycycloolefin, polycycloolefin co-maleic anhydride, polymethyl methacrylate and polyvinyl ether-co-maleic anhydride.

4. The method according to claim 1, wherein filling the reservoir with the immersion liquid comprises
    providing a substantially constant flow of immersion liquid into the reservoir through one portion of the reservoir and out of the reservoir through another portion of the reservoir.

5. The method according to claim 1, wherein exposing the photoresist layer comprises:
    (a) providing a process substrate having a photoresist layer thereon between the substrate chuck and the reservoir, such that the photoresist layer faces the reservoir;
    (b) filling the reservoir with the immersion liquid such that a surface of the photoresist layer contacts the immersion liquid;
    (c) sequentially passing exposing radiation through the pattern-transferring system and the immersion liquid to selected portions of the photoresist layer;
    (d) detaching the process substrate from the substrate chuck; and optionally
    (e) repeating steps (a) through (d) with at least one other process substrate.

6. The method according to claim 5, wherein step (d) further comprises
    providing the gettering layer between a substrate chuck and an immersion liquid reservoir of an immersion lithography apparatus;
    filling the immersion liquid reservoir with an immersion liquid, thereby contacting the immersion liquid with the gettering layer;
    passing radiation through a pattern transferring system to the gettering layer,
    detaching the gettering layer from the substrate chuck.

7. The method according to claim 1, wherein the monitor substrate comprises single-crystalline silicon, poly-crystalline silicon, amorphous silicon, silicon oxide or any combination thereof.

8. The method according to claim 1, wherein the process substrate comprises single-crystalline silicon, poly-crystalline silicon, amorphous silicon, silicon oxide or any combinations thereof.

9. A method of performing an immersion lithography process comprising
   (a) providing a gettering layer, comprising a monitor substrate and a conditioning layer thereon, between a substrate chuck and an immersion liquid reservoir of an immersion lithography apparatus, wherein the monitor substrate comprises single-crystalline silicon, poly-crystalline silicon, amorphous silicon, silicon oxide or any combination thereof;
   (b) filling the immersion liquid reservoir with an immersion liquid, thereby contacting the immersion liquid with a surface of the gettering layer;
   (c) removing the gettering layer from the substrate chuck;
   (d) providing a process substrate having a photoresist thereon to the substrate chuck; and
   (e) exposing the photoresist to radiation through a pattern transferring system.

10. The method according to claim 9, wherein the conditioning layer comprises hexamethyldisilazane.

11. The method according to claim 9, wherein the conditioning layer comprises at least one fluorinated compound selected from the group consisting of perfluoroacetate, hexafluoroalcohol and polytetrafluoroethylene.

12. The method according to claim 9, wherein the conditioning layer comprises at least one non-fluorinated polymer selected from the group consisting of acrylate, meta-acrylate, polynorbornene, polystyrene, polyethylene, polycycloolefin, polycycloolefin co-maleic anhydride, polymethyl methacrylate and polyvinyl ether-co-maleic anhydride.

13. The method according to claim 9, wherein filling the reservoir with the immersion liquid comprises providing a substantially constant flow of immersion liquid into the reservoir through one portion of the reservoir and out of the reservoir through another portion of the reservoir.

14. The method according to claim 9, wherein exposing the photoresist layer comprises:
   (a) providing a process substrate having a photoresist layer thereon between the substrate chuck and the reservoir, such that the photoresist layer faces the reservoir;
   (b) filling the reservoir with the immersion liquid such that a surface of the photoresist layer contacts the immersion liquid;
   (c) sequentially passing exposing radiation through the pattern-transferring system and the immersion liquid to selected portions of the photoresist layer;
   (d) detaching the process substrate from the substrate chuck; and optionally
   (e) repeating steps (a) through (d) with at least one other process substrate.

15. The method according to claim 9, wherein step (d) further comprises
   providing the gettering layer between a substrate chuck and an immersion liquid reservoir of an immersion lithography apparatus;
   filling the immersion liquid reservoir with an immersion liquid, thereby contacting the immersion liquid with the gettering layer;
   passing radiation through a pattern transferring system to the gettering layer,
   detaching the gettering layer from the substrate chuck.

16. The method according to claim 9, wherein the process substrate comprises single-crystalline silicon, poly-crystalline silicon, amorphous silicon, silicon oxide or any combinations thereof.

* * * * *